(12) United States Patent
Ho et al.

(10) Patent No.: US 10,637,358 B2
(45) Date of Patent: Apr. 28, 2020

(54) CURRENT CONTROL CIRCUIT

(71) Applicant: MOSWAY SEMICONDUCTOR LTD., Hong Kong (CN)

(72) Inventors: Ka Wai Ho, Hong Kong (CN); Chung Pui Tung, Hong Kong (CN); Po Wa Chow, Hong Kong (CN); Wing To Fan, Hong Kong (CN); Wan Tim Chan, Hong Kong (CN); Shu Hung Henry Chung, Hong Kong (CN); Chiu Sing Tse, Hong Kong (CN)

(73) Assignee: Mosway Semiconductor Limited, Hong Kong (CN)

(*) Notice: Subject to any disclaimer, the term of this patent is extended or adjusted under 35 U.S.C. 154(b) by 192 days.

(21) Appl. No.: 15/845,122

(22) Filed: Dec. 18, 2017

(65) Prior Publication Data

US 2019/0190389 A1  Jun. 20, 2019

(51) Int. Cl.
| | |
|---|---|
| *H02M 3/335* | (2006.01) |
| *H02M 1/08* | (2006.01) |
| *H03K 3/64* | (2006.01) |
| *H03K 5/24* | (2006.01) |
| *H03G 3/30* | (2006.01) |
| *H03L 7/085* | (2006.01) |
| *G05F 3/24* | (2006.01) |

(52) U.S. Cl.
CPC ......... *H02M 3/33515* (2013.01); *G05F 3/24* (2013.01); *H02M 1/08* (2013.01); *H03G 3/30* (2013.01); *H03K 3/64* (2013.01); *H03K 5/2481* (2013.01); *H03L 7/085* (2013.01); *H02M 3/33507* (2013.01)

(58) Field of Classification Search
None
See application file for complete search history.

(56) References Cited

U.S. PATENT DOCUMENTS

| | | | | |
|---|---|---|---|---|
| 2012/0280622 | A1* | 11/2012 | Jeong | H05B 33/083 315/122 |
| 2013/0207620 | A1* | 8/2013 | Li | H02J 3/1842 322/37 |
| 2018/0048230 | A1* | 2/2018 | Park | G05F 1/56 |

* cited by examiner

*Primary Examiner* — Jared Fureman
*Assistant Examiner* — Aqeel H Bukhari
(74) *Attorney, Agent, or Firm* — Leydig, Voit & Mayer, Ltd.

(57) ABSTRACT

A current control circuit having a current regulation element, a first control circuit, and a second control circuit. The first control circuit is arranged to regulate, based on a reference current, a current flowing with respect to the current regulation element. The second control circuit is arranged to regulate, based on a reference voltage, a voltage across the current regulation element.

30 Claims, 11 Drawing Sheets

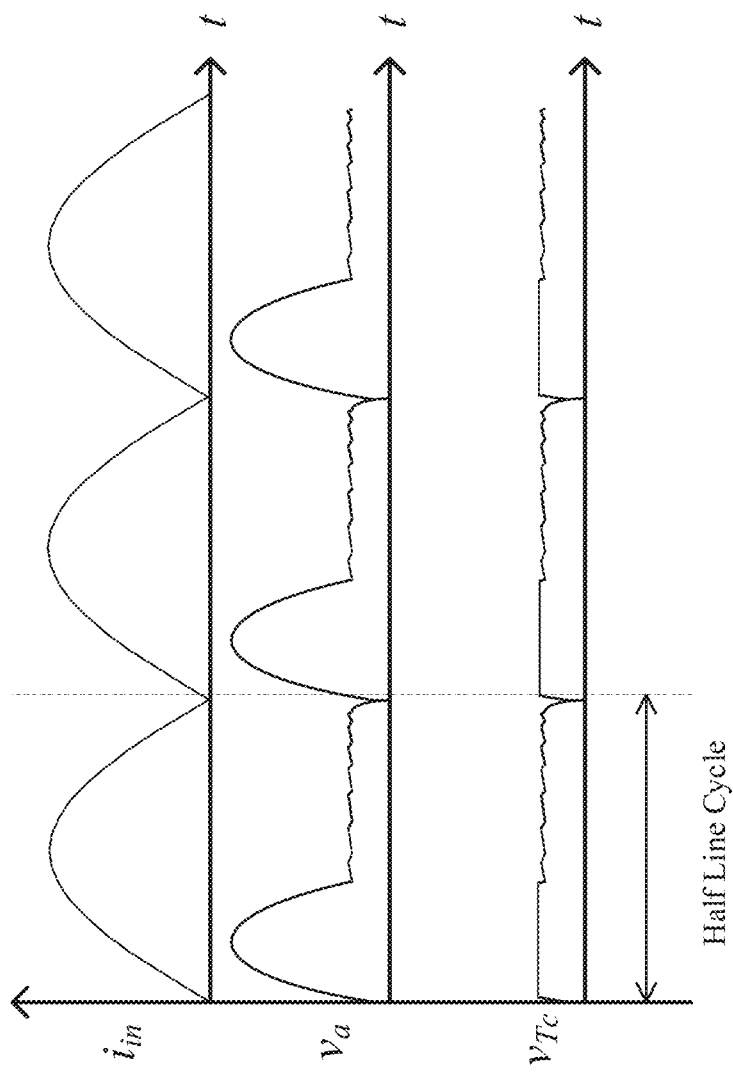

CURRENT CONTROL CIRCUIT

TECHNICAL FIELD

The invention relates to a current control circuit arranged to regulate current transfer between a source and a load.

BACKGROUND

Current control circuits are generally arranged between a current source and a load for regulating current flow, either unidirectional current flow from the source to the load or bi-directional current flow between the source and the load.

Some existing current control circuits operate as a current source between the source and the load. However, these current sources are not ideal because they have finite internal impedance, and may not be able to maintain their respective current independently of a voltage applied across it. In high voltage applications, these current sources may not be able to deliver current with wide bandwidth.

SUMMARY OF THE INVENTION

In accordance with a first aspect of the invention, there is provided a current control circuit, comprising: a current regulation element; a first control circuit arranged to regulate, based on a reference current, a current passing the current regulation element; and a second control circuit arranged to regulate, based on a reference voltage, a voltage across the current regulation element. In one embodiment of the first aspect, the current control circuit may act as a current source. The current control circuit is particularly adapted for regulating current transfer between a source and a load, and for high-voltage applications.

The reference current may be provided by a voltage signal or a current signal indicative of a reference current value. The reference current may be fixed or adjustable.

The reference voltage may be provided by a voltage signal or a current signal indicative of a reference voltage value. The reference voltage may be fixed or adjustable.

Preferably, the second control circuit comprises a voltage regulation element that is controlled for regulating the voltage across the current regulation element. The voltage regulation element and the current regulation element are preferably connected in series.

Preferably, the current control circuit is regulated such that during operation when the voltage across the current control circuit is larger than the reference voltage, the voltage across the current regulation element is maintained to be substantially equal to the reference voltage; and when the voltage across the current control circuit is smaller than the reference voltage, the voltage across the voltage regulation element is substantially equal to zero.

Preferably, the first control circuit is arranged to: detect current passing the current regulation element; and compare the detected current with the reference current for generation of a control signal, to substantially match the current passing the current regulation element to the reference current. The first control circuit may be further arranged to: generate and provide the control signal to the current regulation element.

Preferably, the second control circuit is arranged to: detect voltage across the current regulation element; and compare the detected voltage with the reference voltage for generation of a control signal, to substantially match the voltage across the current regulation element to the reference voltage. The second control circuit may be further arranged to: generate and provide the control signal to the voltage regulation element.

The current passing the current regulation element may be a current passing into the current regulation element, or alternatively, a current passing out of the current regulation element.

In a preferred embodiment of the first aspect, the current regulation element is a low-voltage current regulation element. Preferably, the current regulation element is a series-pass device. More preferably, the current regulation element is a transistor. In one embodiment of the first aspect, the current regulation element is a bipolar junction transistor, for example, a low-voltage bipolar junction transistor.

Preferably, the voltage regulation element is a series-pass device. More preferably, the voltage regulation element is a transistor. In one embodiment of the first aspect, the voltage regulation element is a MOSFET or a bipolar junction transistor. Preferably, the voltage regulation element is not part of a switched-mode power converter.

Preferably, the current control circuit further comprises: at least one further current regulation element, each arranged to be connected in parallel with the current regulation element; and at least one further first control circuit, each associated with a respective further current regulation element and being arranged to regulate, based on a respective reference current, a current passing the corresponding further current regulation element. The reference current(s) for the further first control circuit(s) need not be the same as the reference current for the first control circuit. Likewise, the reference currents for different further first control circuits need not be the same. Each of the reference current may be provided by a voltage signal or a current signal indicative of a corresponding reference current value. The reference currents may be fixed or adjustable.

In a preferred embodiment of the first aspect, the further current regulation element is a low-voltage current regulation element. Preferably, the further current regulation element is a series-pass device. More preferably, the further current regulation element is a transistor. In one embodiment of the first aspect, the further current regulation element is a bipolar junction transistor, for example, a low-voltage bipolar junction transistor.

Preferably, the current control circuit further comprises: a first coordination-controller for controlling the reference current for the first control circuit and the respective reference current for each of the at least one further first control circuit.

Preferably, the current control circuit further comprises: at least one further second control circuit arranged to regulate, based on a respective reference voltage, a voltage across the current regulation element; each of the at least one further second control circuit includes a respective further voltage regulation element that is correspondingly controlled for regulating the voltage across the current regulation element. The reference voltage(s) for the further second control circuit(s) need not be the same as the reference voltage for the second control circuit. Likewise, the reference voltages for different further first control circuits need not be the same. Each of the reference voltage may be provided by a voltage signal or a current signal indicative of a corresponding reference voltage value. The reference voltages may be fixed or adjustable.

Preferably, each of the further voltage regulation elements is a series-pass device. More preferably, the further voltage regulation element is a transistor. In one embodiment of the first aspect, the further voltage regulation element is a MOSFET or bipolar junction transistor. Preferably, the further voltage regulation element is not part of a switched-mode power converter.

In one embodiment of the first aspect, at least one of the further voltage regulation elements may be connected in parallel with the voltage regulation element. In another embodiment of the first aspect, at least one of the further voltage regulation elements may be connected in series with the voltage regulation element.

Preferably, the current control circuit further comprises: a second coordination-controller for controlling the reference voltage for the second control circuit and the respective reference voltage for each of the at least one further second control circuit.

The first and second coordination-controllers may be separate controllers, or they may be integrated as a single controller.

In accordance with a second aspect of the invention, there is provided a current control circuit, comprising: at least one current regulation element; at least one first control circuit, each associated with a respective current regulation element and arranged for regulating, based on a respective reference current, a current passing the corresponding current regulation element; and at least one second control circuit, each having a voltage regulation element that is correspondingly controlled, for regulating, based on a respective reference voltage, a voltage across the at least one current regulation element. In one embodiment of the second aspect, the current control circuit may act as a current source. The current control circuit is particularly adapted for regulating current transfer between a source and a load, and for high-voltage applications.

The at least one current regulation element may be the current regulation element and the further current regulation element(s) of the first aspect. The at least one first control circuit may be the first control circuit and the further first control circuit(s) of the first aspect. The at least one voltage regulation element may be the voltage regulation element and the further voltage regulation element (s) of the first aspect. The at least one second control circuit may be the second control circuit and the further second control circuit (s) of the first aspect.

Preferably, the current control circuit comprises a plurality of current regulation elements connected in parallel, and a corresponding plurality of first control circuits.

Preferably, the current control circuit further comprises a first coordination-controller for controlling the respective reference current for the plurality of first control circuits.

Preferably, the current control circuit comprises a plurality of second control circuits, wherein the voltage regulation elements are connected: in parallel; in series; or at least some in parallel and at least some in series. In one embodiment of the second aspect, the voltage regulation elements may be arranged in an array, with some connected in series and some connected in parallel. The current control circuit may form a current control circuit module.

Preferably, the current control circuit further comprises a second coordination-controller for controlling the respective reference voltage for the plurality of second control circuits.

The first and the second coordination-controllers may be separate controllers, or they may be integrated as a single controller.

In accordance with a third aspect of the invention, there is provided a current control circuit comprising a plurality of current control circuit modules of the second aspect.

In accordance with a fourth aspect of the invention, there is provided a power factor correction circuit including the current control circuit of the first aspect.

In accordance with a fifth aspect of the invention, there is provided a power factor correction circuit including the current control circuit of the second aspect.

In accordance with a sixth aspect of the invention, there is provided a power factor correction circuit including the current control circuit of the third aspect.

BRIEF DESCRIPTION OF THE DRAWINGS

Embodiments of the invention will now be described, by way of example, with reference to the accompanying drawings in which:

FIG. 10 is a plot showing the key waveforms in the circuit of FIG. 9;

DETAILED DESCRIPTION OF THE PREFERRED EMBODIMENT

Figure 1:
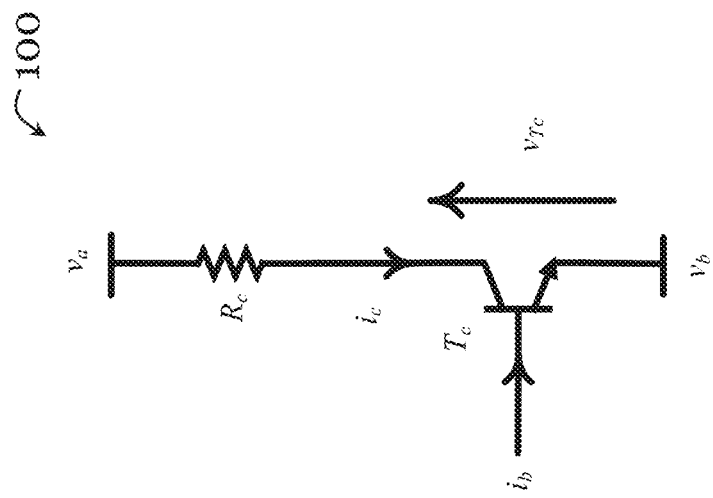
FIG. 1 is a circuit diagram of an exemplary current source.

FIG. 1 shows a current source 100 including a single bipolar junction transistor $T_c$ connected in series with a resistor $R_c$, between nodes $v_a$, and $v_b$. The bipolar junction transistor $T_c$ has a collector-emitter voltage of $v_{Tc}$. When the operating point of the bipolar junction transistor $T_c$ is biased in the linear region, the collector current $i_c$ is determined by the base current $i_b$. In this linear region, an approximation of the transfer characteristic between the collector current $i_c$ and the base current $i_b$ is $$i_c = \beta i_b \qquad (1)$$

where β is the current gain. The relationship may also be applicable to other transistors. Equation (1) suggests that the collector current $i_c$ is linearly proportional to the base current $i_b$. However, this may not be the case in practice because the current gain β of transistors may vary under the influence of various intrinsic and extrinsic factors. Generally, the transfer characteristic of low-voltage transistor devices exhibits a more linear behavior (as equation (1)) when compared to that of high-voltage transistor devices.

Figure 2B:
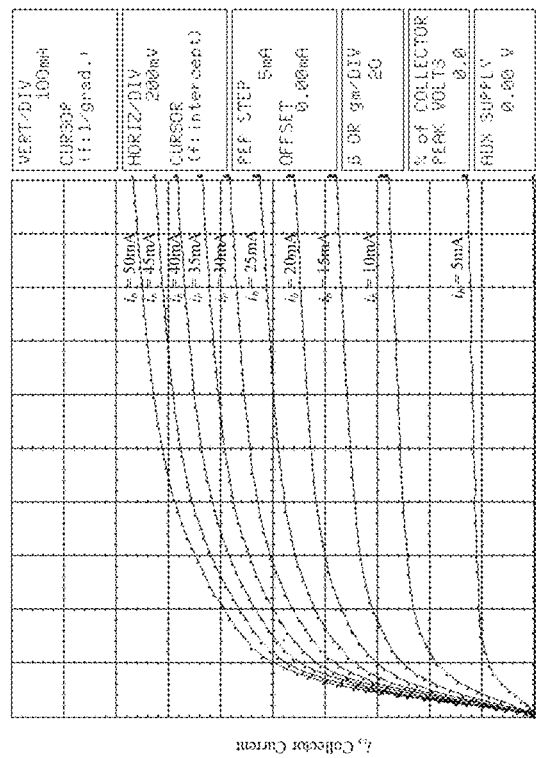
FIG. 2B is a graph showing transfer characteristics of an existing high-voltage bipolar junction transistor (Model no.: TIP50G)
Figure 2A:
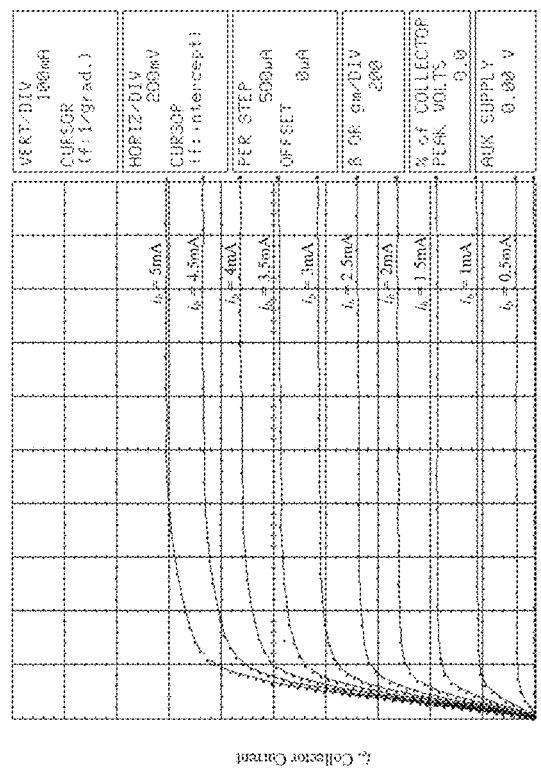
FIG. 2A is a graph showing transfer characteristics of an existing low-voltage bipolar junction transistor (Model no.: MJD44H11TA9)

FIGS. 2A and 2B show the transfer characteristics of an existing low-voltage bipolar junction transistor (Model no.: MJD44H11TA9) and an existing high-voltage bipolar junction transistor (Model no.: TIP50G). As illustrated in FIG. 2A, for a given base current $i_b$, the collector current $i_c$ of the low-voltage bipolar junction transistor is substantially constant over the operating range of the collector-emitter voltage $v_{ce}$. However, as illustrated in FIG. 2B, the collector current $i_c$ of the high-voltage bipolar junction transistor gradually increases with the collector-emitter voltage $v_{ce}$. Such characteristics imply that the equivalent output impedance of high-voltage bipolar junction transistors is much smaller than that of low-voltage bipolar junction transistors.

One way to address this problem particularly prominent to high-voltage bipolar junction transistors is to introduce a feedback control mechanism to regulate the collector current $i_c$, for example, by sensing the collector current $i_c$ then adjusting the base current $i_b$. However, the bandwidth of the frequency response of high-voltage transistor devices is narrow. As a result, current control circuits with such high-voltage transistor devices cannot deliver regulated current of wide bandwidth.

Figure 3:
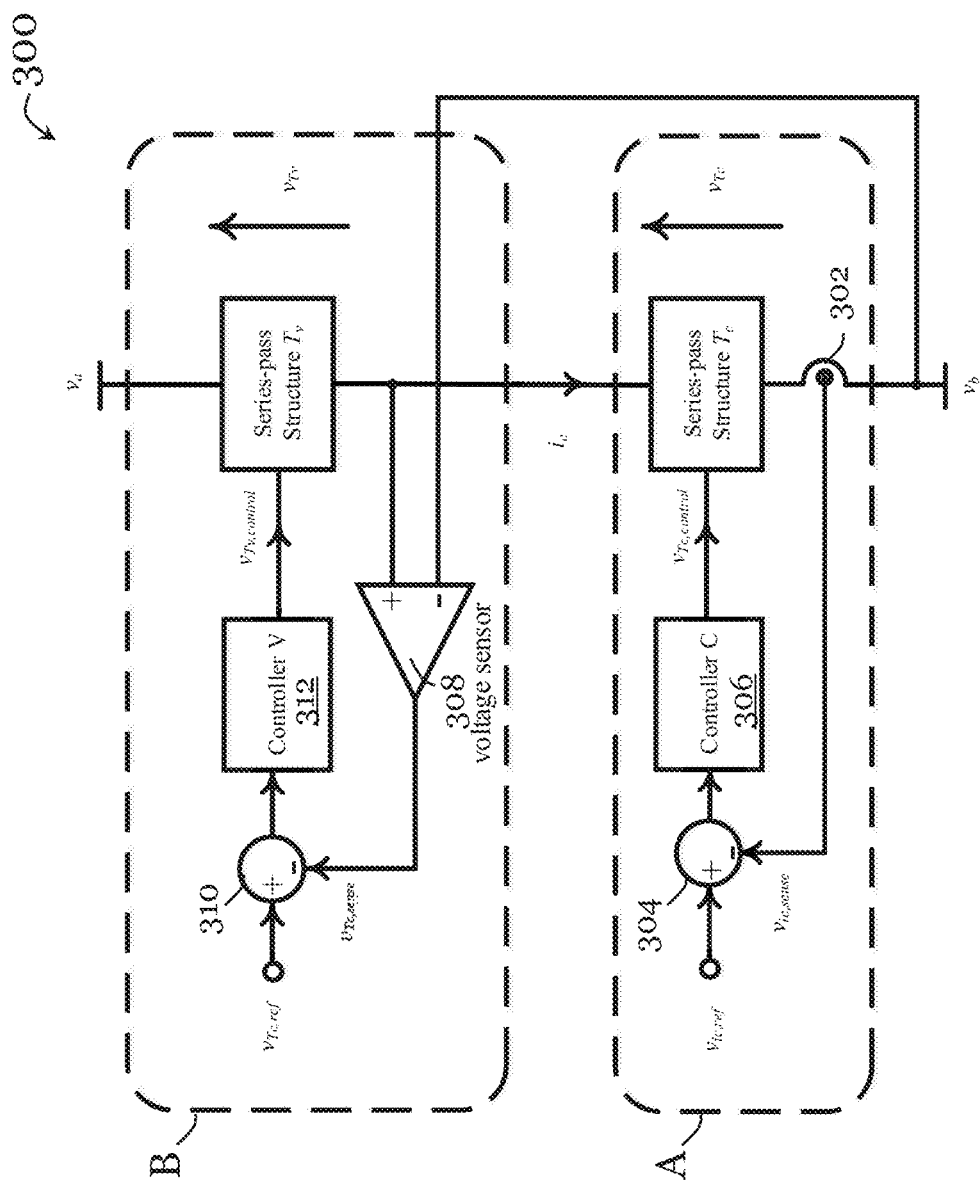
FIG. 3 is a circuit diagram showing a current control circuit in one embodiment of the invention.

FIG. 3 shows a current control circuit 300 in one embodiment of the invention. The current control circuit 300 is particularly adapted for high-voltage applications. The current control circuit 300 includes a series-pass structure $T_c$ arranged to act as a current regulation element.

A first control circuit is arranged to regulate the current passing into or out of the series-pass structure $T_c$. The first control circuit includes a detector 302 arranged to detect current passing the series-pass structure $T_c$, a comparator 304 for comparing the detected current (in the form of a voltage signal $v_{ic,sense}$) with a reference current (in the form of a voltage signal $v_{ic,ref}$), and a controller 306 for generating and providing a control signal to the series-pass structure $T_c$ to substantially match the current passing the series-pass structure $T_c$ to the reference current. In some other embodiments, the detector 302, comparator 304, and controller 306 may be implemented in one or more controllers.

A second control circuit is arranged to regulate the voltage across the series-pass structure $T_c$. The second control circuit includes a series-pass structure $T_v$ arranged to operate as a voltage regulation element, connected in series with the series-pass structure $T_c$. The two series pass structures $T_v$ and $T_c$ are arranged between nodes $v_a$ and $v_b$. The second control circuit also includes a voltage sensor 308, in the form of an operational amplifier, for detecting voltage across series-pass structure $T_c$, a comparator 310 for comparing the detected voltage (in the form of a voltage signal $v_{Tc,sense}$) with a reference voltage (in the form of a voltage signal $v_{Tc,ref}$), and a controller 312 for generating and providing a control signal to control the series-pass structure $T_v$ and hence to substantially match the voltage $v_{Tc}$ across the series-pass structure $T_c$ to the reference voltage. During operation, the voltage $v_{Tc}$ across the series-pass structure $T_c$ may be substantially equal to the reference voltage signal $v_{Tc,ref}$. In other words, at any moment in the time, the voltage $v_{Tc}$ across the series-pass structure $T_c$ may be slightly larger than or slightly smaller than the reference voltage signal $v_{Tc,ref}$. In some other embodiments, the sensor 308, comparator 310, and controller 312 may be implemented in one or more controllers.

In FIG. 3, the series-pass structure $T_c$ and the first control circuit are collectively referred to as a current regulator A, while the second control circuit is referred to as a voltage regulator B. In the present embodiment, the current regulator A is implemented with low-voltage series-pass devices. The control circuit in the current regulator A is arranged to regulate the current through the series-pass structure $T_c$ with relatively wide frequency bandwidth. The voltage regulator B is used to regulate the voltage across the series-pass structure $T_c$. In operation, a voltage across the series-pass structure $T_v$ may be larger than a voltage across the series-pass structure $T_c$. In one embodiment, when the voltage across the current control circuit is larger than the reference voltage $v_{Tc,ref}$, the voltage across the current regulation element is maintained to be substantially equal to the reference voltage $v_{Tc,ref}$, and when the voltage across the current control circuit is smaller than the reference voltage $v_{Tc,ref}$, the voltage across the voltage regulation element is substantially equal to zero.

Figure 4:
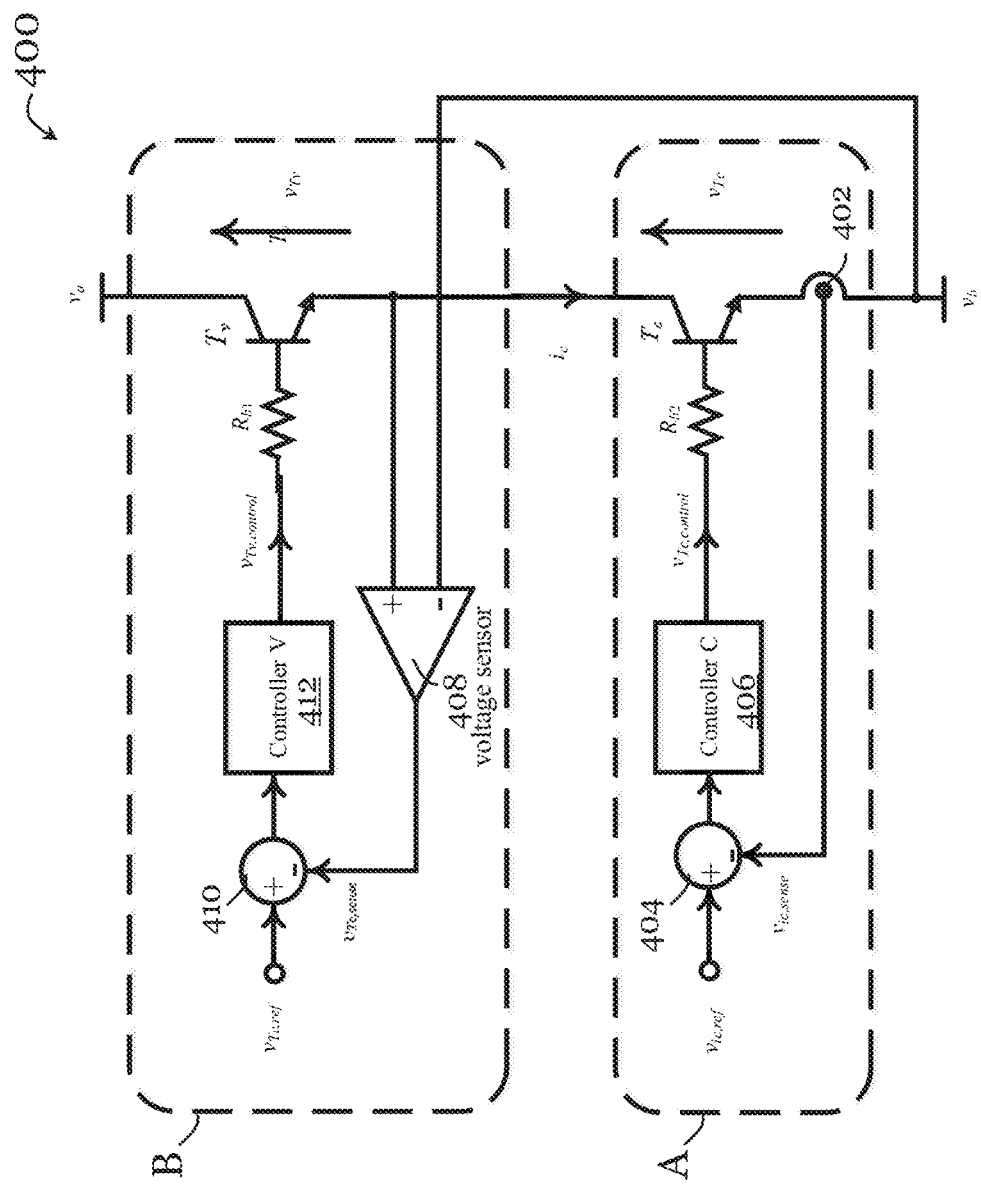
FIG. 4 is a circuit diagram showing an implementation of the current control circuit of FIG. 3.

FIG. 4 shows an implementation of the circuit 300 of FIG. 3. As shown in FIG. 4, the series-pass structure $T_c$ and the series-pass structure $T_v$ in the circuit 400 are bipolar junction transistors.

Similar to the circuit 300 in FIG. 3, in operation of the circuit 400 of FIG. 4, the bipolar junction transistor $T_c$ is the main current control element. It is controlled by a sensor 402, a comparator 404, and a controller 406, which respective sense a current of the bipolar junction transistor $T_c$, compare the sensed current of the bipolar junction transistor $T_c$ with a reference current $I_{ref}$ (in the form of a voltage signal $v_{ic,ref}$), and generate a corresponding driving signal to the base of the bipolar junction transistor $T_c$ with an error amplifier (not shown). If the current delivered by the bipolar junction transistor $T_c$ is smaller than $I_{ref}$, the controller 406 will increase the current to the base of bipolar junction transistor $T_c$. If the current delivered by the bipolar junction transistor $T_c$ is larger than $I_{ref}$, the controller 406 will decrease the current to the base of bipolar junction transistor $T_c$. In FIG. 4, the emitter current of bipolar junction transistor $T_c$ is sensed for control. However, in another embodiment, the collector current $i_c$ may be sensed instead. In practice, the value of the emitter current is very close to the value of the collector current $i_c$ as the base current $i_b$ is significantly smaller than the collector current $i_c$.

The bipolar junction transistor $T_v$ is the main element in the voltage regulator B for regulating the voltage across the bipolar junction transistor $T_c$. The bipolar junction transistor $T_v$ is controlled by a sensor 408, a comparator 410, and a controller 412, which respectively sense the collector-emitter voltage of the bipolar junction transistor $T_c$, compare it with a reference voltage $v_{ref}$ (in the form of a voltage signal $v_{Tc,ref}$), and generate a driving signal to the base of bipolar junction transistor $T_v$ with an error amplifier (not shown). The bipolar junction transistor $T_v$ shares a large portion of the voltage across the current control circuit 400. If the voltage across the bipolar junction transistor $T_c$ is higher than $v_{ref}$, the error amplifier will reduce the current to the base of the bipolar junction transistor $T_v$. If the voltage across the bipolar junction transistor $T_c$ is lower than $v_{ref}$, the error amplifier will increase the current to the base of the bipolar junction transistor $T_v$.

Figure 5:
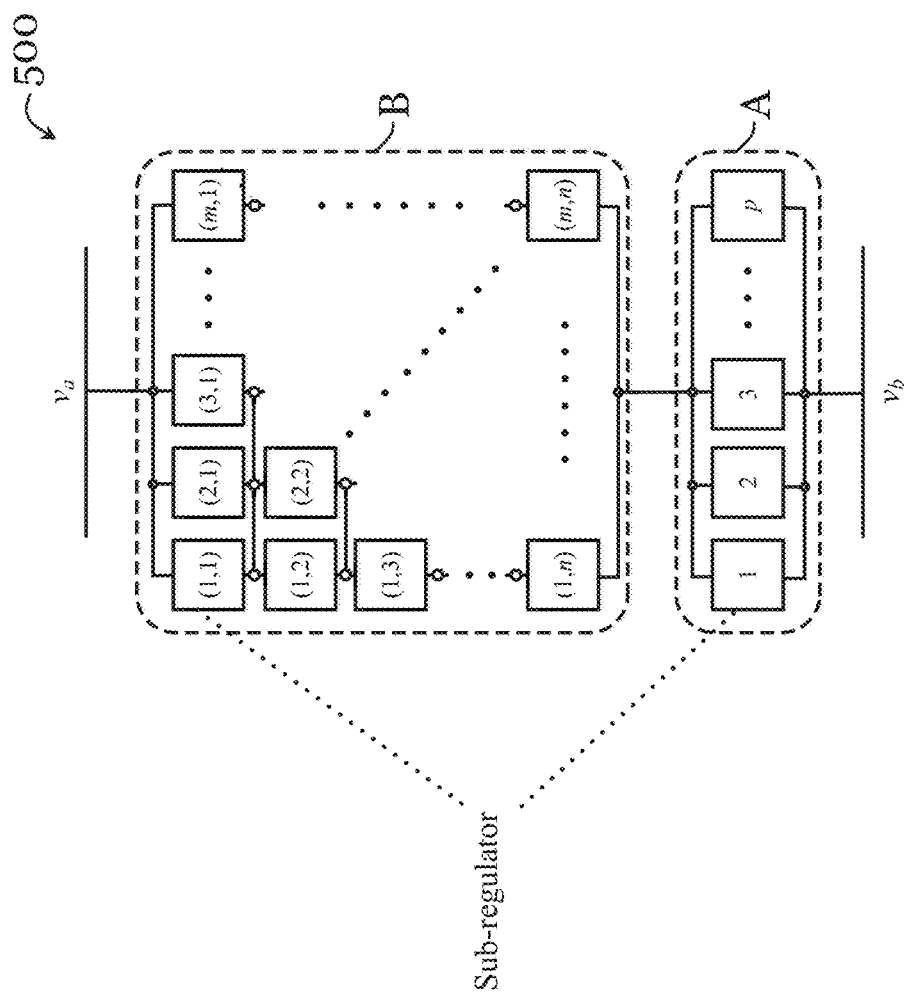
FIG. 5 is a circuit diagram showing a current control circuit in another embodiment of the invention.

FIG. 5 shows a current control circuit 500 in another embodiment of the invention. The current control circuit 500 in FIG. 5 is generally the same as the circuits 300, 400 of FIGS. 3 and 4, expect that the voltage regulator B divided into sub-voltage regulators and current regulator A divided into sub-current regulators. The circuit 500 in FIG. 5 allows for use of low-voltage and low-current devices for improved operation efficiency and effectiveness.

As illustrated in FIG. 5, the current regulator A is realized by paralleling P multiple current regulators, referred to as sub-current regulators, of smaller current ratings. Each sub-current regulator is controlled with a respective controller to regulate its current at the assigned current reference. The current reference $I_{ref,1}$, $I_{ref,2}$, ..., $I_{ref,P}$ for the sub-current regulators are controlled by a coordination controller. One or more of these controllers may be implemented together on the same controller. The parallel-connected structure provides current sharing feature to the current flowing through the current regulator A.

The voltage regulator B is realized by a matrix of M (rows)×N (columns) of low-voltage voltage regulators, referred to as sub-voltage regulators. The sub-voltage regulators of the same row are connected in parallel. That is, each row has N sub-voltage regulators connected in parallel. M rows of sub-voltage regulators are connected in series. Each sub-voltage regulator is controlled with a respective controller to regulate its voltage at the assigned voltage reference. The voltage references $V_{ref1,1}$, $V_{ref1,2}$, ..., $V_{ref,M,N}$ for the sub-voltage regulators are generated by a coordinated controller. One or more of these controllers may be implemented together on the same controller. For the voltage regulator B, the parallel-connected structure provides current sharing feature to the current flow through the voltage regulator B, and the series-connected structure provide voltage sharing feature to the voltage stress applied across the voltage regulator B.

By implementing the series and parallel connected structures as illustrated in FIG. 5, voltage and current control with different magnitudes and frequencies can be distributed to different sub-regulators, respectively, and so that the dynamic response of the current control circuit 500 can be further improved.

Figure 6:
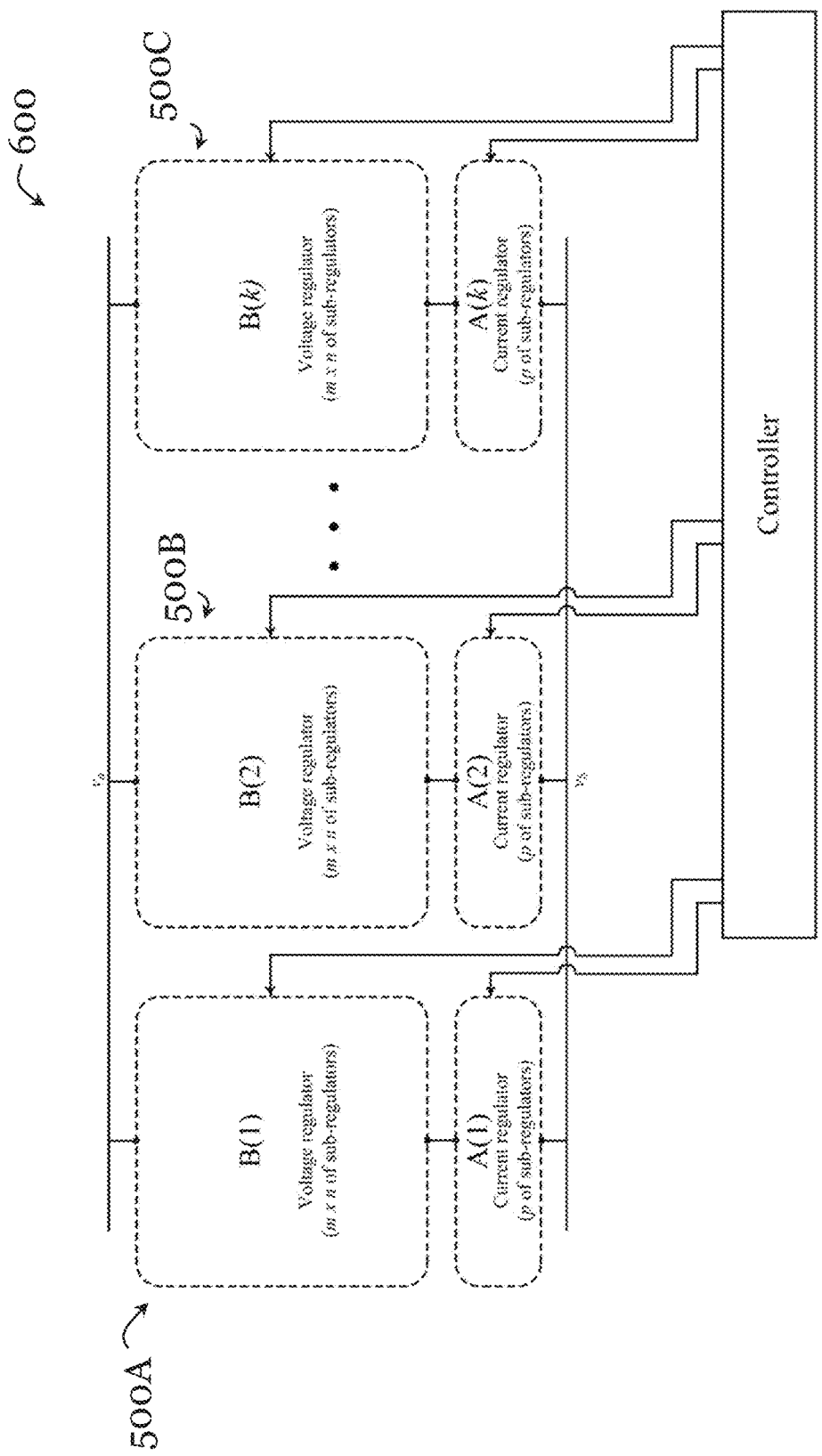
FIG. 6 is a circuit diagram showing a current control circuit in yet another embodiment of the invention.

FIG. 6 shows a current control circuit 600 in yet another embodiment of the invention. The circuit 600 is formed by multiple current control circuits 500A, 500B, 500C of like construction (similar to current control circuit 500 of FIG. 5), connected in parallel between the source and the load. A common controller controls the operation of the different current control circuits 500A, 500B, 500C.

To verify the performance of the current control circuit 300 of the above embodiment, a current control circuit is built and applied to control the input current waveform of a power factor corrector using flyback DC/DC converter.

Figure 7:
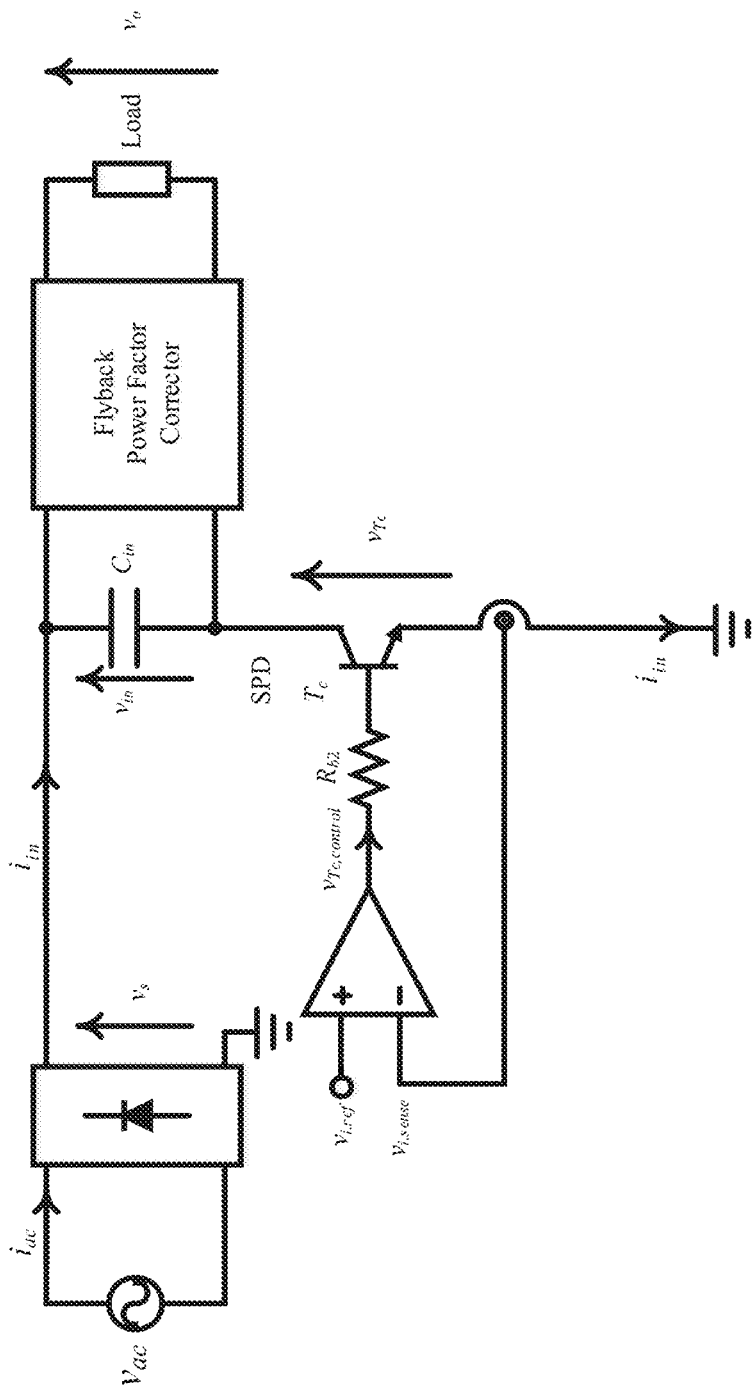
FIG. 7 is a circuit diagram showing a power factor correction circuit.

FIG. 7 shows a power factor correction circuit without the use of the current control circuit of the invention. As shown in FIG. 7, a series-pass device $T_c$ is connected in series with the input of the flyback converter. The voltage $v_{Tc}$ across the series-pass device $T_c$ is regulated at a low level by changing the switching frequency and duty cycle of the main switch in the flyback DC/DC converter. By adjusting the control signal to the series-pass device $T_c$, the input current of the flyback power factor corrector is profiled to be in phase with the supply voltage for regulating the output voltage.

Figure 8:
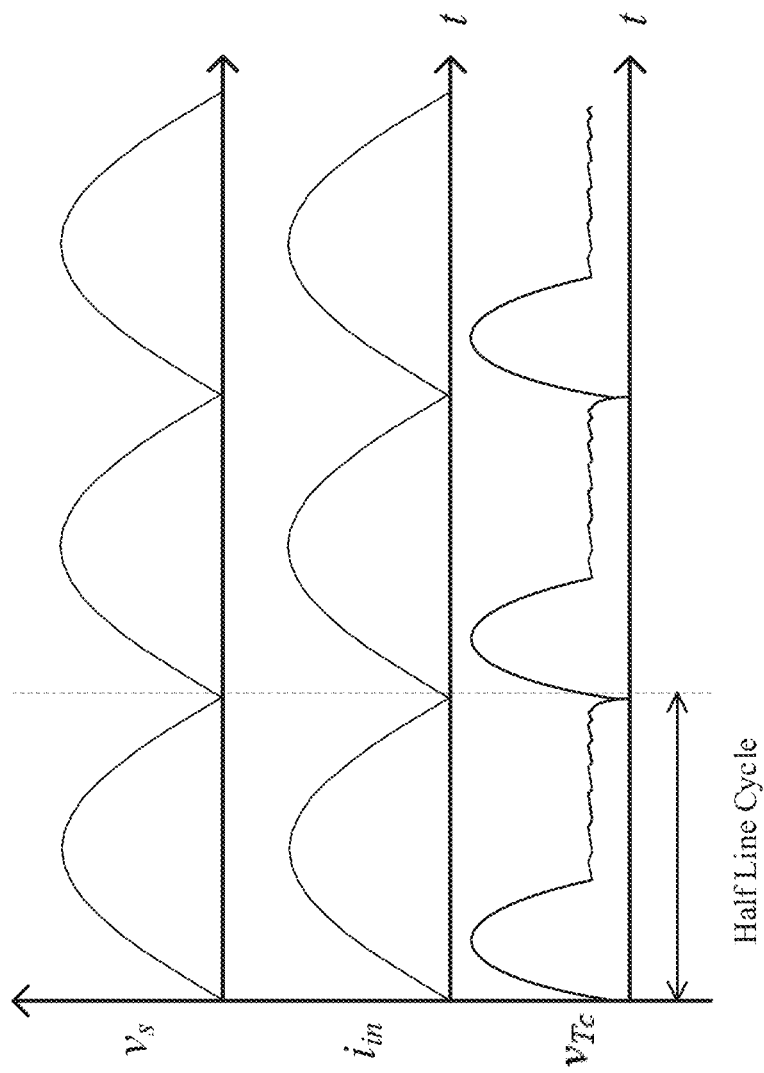
FIG. 8 is a plot showing the key waveforms in the circuit of FIG. 7.

FIG. 8 shows the key waveforms for the supply voltage $v_s$, the input current $i_{in}$, and the voltage $v_{Tc}$ across the series-pass device $T_c$ in the circuit of FIG. 7. At the starting point of each half line cycle, the input capacitor $C_{in}$ connected across the flyback power factor corrector will be charged up by the supply voltage $v_s$, following the input current $i_{in}$. However, within that time, the value of the input current $i_{in}$ is small. The increase of the voltage $v_{in}$ across the capacitor $C_{in}$ could not timely follow the increase of the supply voltage $v_s$. Therefore, the voltage difference between the supply voltage $v_s$ and the capacitor voltage $v_{in}$ will be applied to the series-pass device $T_c$. Following the increase in the input current $i_{in}$, the rising speed of $v_{in}$ increases. The difference between the supply voltage $v_s$ and the capacitor voltage $v_{in}$ is reduced. Thus, the voltage $v_{Tc}$, across the series-pass device $T_c$ will back to the level equal to the reference voltage $v_{ref}$. In other words, voltage stress (voltage $v_{Tc}$, across the series-pass device $T_c$) is particularly high when the input current $i_{in}$ is low and the supply voltage $v_s$ is high. In one example, when the input current is zero or close to zero, all or substantially all voltage stress from supply side will be applied across the series-pass device $T_c$. In such case, a low-voltage device cannot be used for high-voltage application.

Figure 9:
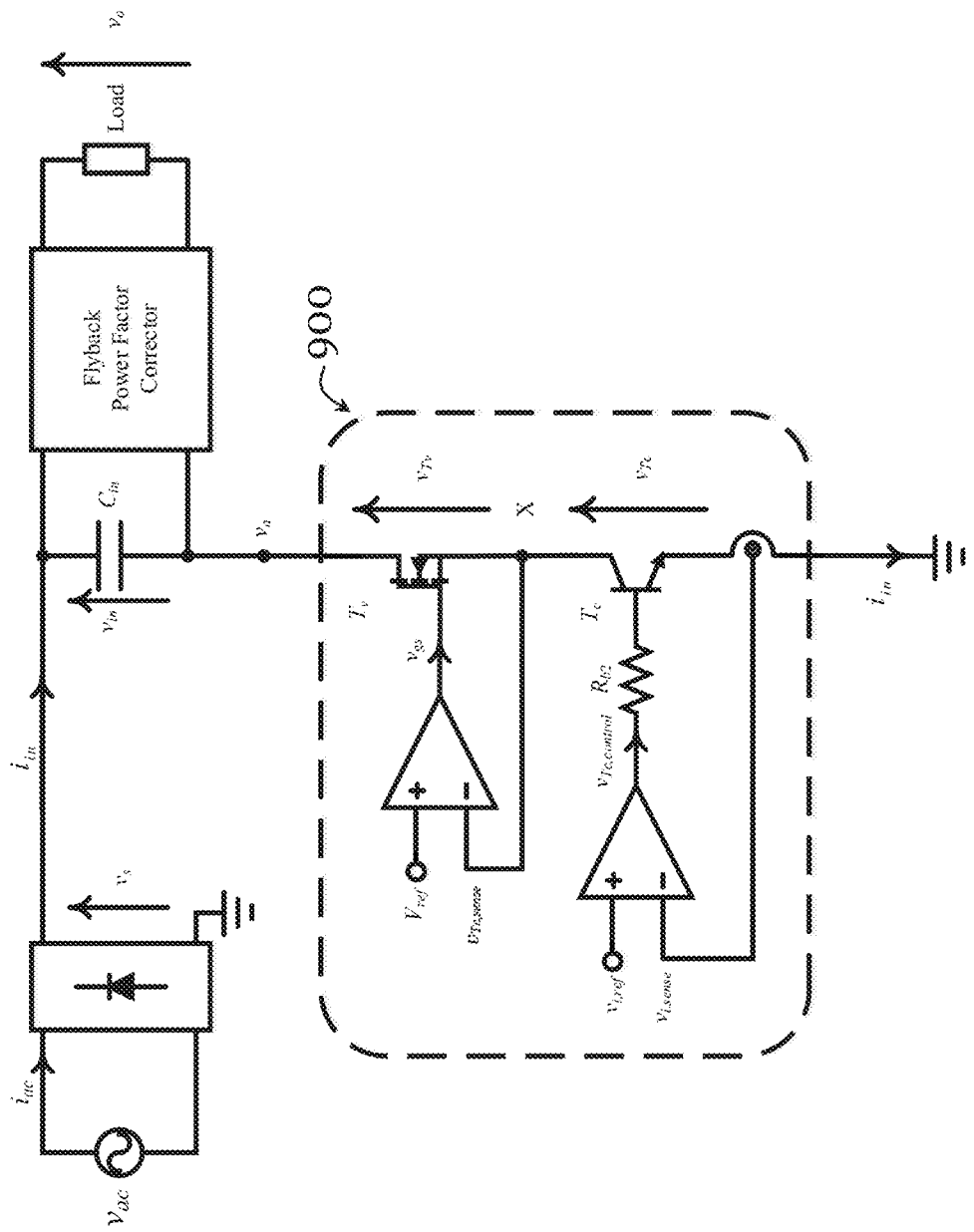
FIG. 9 is a is a circuit diagram showing a power factor correction circuit incorporating a current control circuit in one embodiment of the invention.

FIG. 9 shows a power factor correction circuit incorporating a current control circuit 900 in one embodiment of the invention. In the current control circuit 900 of FIG. 9, the current regulation element $T_c$ is implemented by using a bipolar junction transistor, and voltage regulation element $T_v$ is implemented by using a MOSFET. Operational amplifiers are used as the controllers in the two control circuits. The operation of the circuit 900 is generally the same as that described with reference to FIGS. 3 and 4.

FIG. 10 shows the key waveforms for the input current $i_{in}$, the voltage at $v_a$, and the voltage $v_{Tc}$, across the bipolar junction transistor $T_c$ in the circuit 900 of FIG. 9. As illustrated, a large voltage fluctuation is present at the beginning of every half line cycle. When the voltage fluctuation is present across the circuit, most of the voltage will be dropped across the MOSFET $T_v$. Therefore, the input current $i_{in}$ can be properly regulated and the bipolar junction transistor $T_c$ can operate under low voltage stress.

Figure 11B:
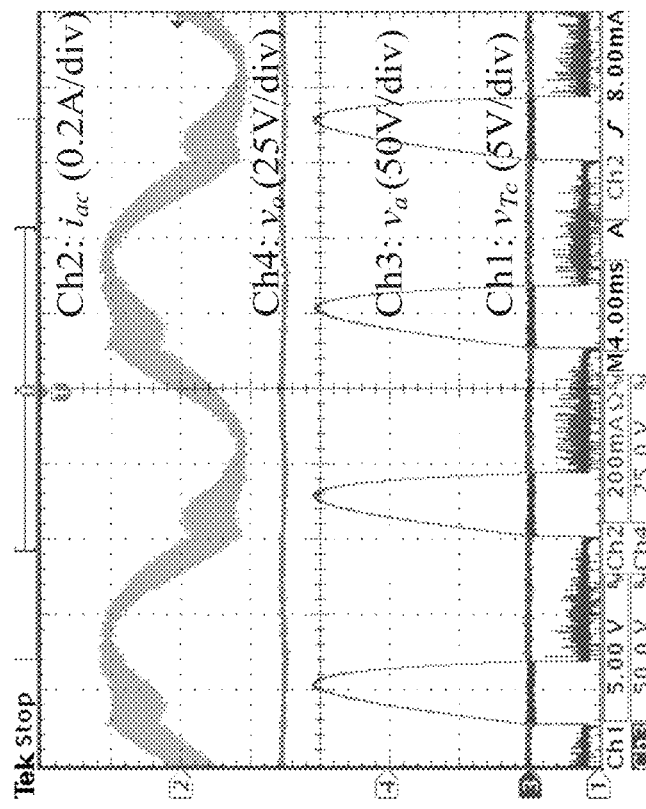
FIG. 11B is a graph showing steady-state waveforms in the circuit of FIG. 9.
Figure 11A:
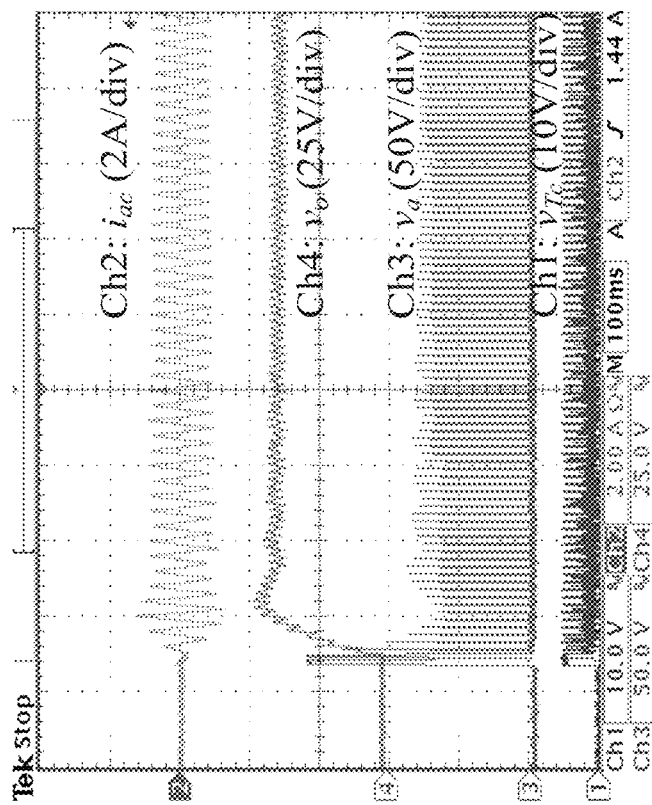
FIG. 11A is a graph showing start-up transient waveforms in the circuit of FIG. 9.

FIGS. 11A and 11B are graphs showing start-up transient waveforms and steady-state waveforms in the circuit 900 of FIG. 9. In the tests, the supply voltage is $265V_{ac}$ and the reference voltage $V_{ref}$ is set to 5V. The waveforms show that the voltage across the bipolar junction transistor $T_c$, can be controlled to be below 5V and the extra 150V are distributed to the MOSFET $T_v$.

The above embodiments of the invention provide respective current control circuit that is arranged to effectively regulate current between source and load. The current control circuits are particularly adapted for high-voltage application, especially in cases when low-voltage current regulation element is used. The current control circuit may be connected in series between the load and the source. In operation, the voltage across current regulation element can be clamped when the voltage stress across exceeds a reference value. Advantageously, the current control circuit can operate under low and stable voltage stress so that low-voltage current regulation element can be used in high-voltage applications.

It will be appreciated by persons skilled in the art that numerous variations and/or modifications may be made to the invention as shown in the specific embodiments without departing from the spirit or scope of the invention as broadly described. For example, the current regulation element may be implemented using devices other than series-pass devices. The current regulation element may be implemented using transistors other than bipolar junction transistors, or with any circuits or modules that is arranged to operate as a current source. Likewise, the voltage regulation element may be implemented using devices or circuits other than series-pass devices. For example, the voltage regulation element may be implemented using transistors other than MOSFETs or bipolar junction transistors. The voltage across the voltage regulation element can be equal to or smaller than the voltage across the current regulation element. In embodiments with multiple voltage regulation elements, these elements may be arranged solely in series, solely in parallel, or in an array with both series and parallel connections. More generally, the array may include any number of rows and columns. The current control circuit may be used in other circuits, not necessarily power factor correction circuits. The present embodiments are, therefore, to be considered in all respects as illustrative and not restrictive.

The invention claimed is:

1. A current control circuit comprising:
a first current regulation element;
a first control circuit arranged to regulate, based on a reference current, current flowing with respect to the first current regulation element; and
a second control circuit arranged to regulate, based on a reference voltage, voltage across the first current regulation element, wherein the first control circuit is arranged to
detect current passing the first current regulation element, and
compare the current detected with the reference current for generation of a control signal, to substantially match the current flowing with respect to the first current regulation element to the reference current.

2. The current control circuit of claim 1, wherein the second control circuit comprises a first voltage regulation element that is controlled for regulating the voltage across the first current regulation element.

3. The current control circuit of claim 2, wherein the first voltage regulation element is connected in series with the first current regulation element.

4. The current control circuit of claim 2, wherein, during operation,
when the voltage across the current control circuit is larger than the reference voltage, voltage across the first current regulation element is maintained to be substantially equal to the reference voltage; and
when the voltage across the current control circuit is smaller than the reference voltage, the voltage across the first voltage regulation element is substantially equal to zero.

5. The current control circuit of claim 2, wherein the first voltage regulation element is a series-pass device.

6. The current control circuit of claim 2, wherein the first voltage regulation element is a transistor.

7. The current control circuit of claim 6, wherein the first voltage regulation element is a MOSFET.

8. The current control circuit of claim 2, further comprising at least one third control circuit arranged to regulate, based on a respective reference voltage, voltage across the first current regulation element, wherein each of the at least one third control circuits includes a respective second voltage regulation element that is correspondingly controlled for regulating the voltage across the first current regulation element.

9. The current control circuit of claim 8, wherein at least one of the second voltage regulation elements is connected in parallel with the first voltage regulation element.

10. The current control circuit of claim 8, wherein at least one of the second voltage regulation elements is connected in series with the first voltage regulation element.

11. The current control circuit of claim 8, further comprising a coordination-controller for controlling the reference voltage for the second control circuit and the respective reference voltage for each of the at least one third control circuits.

12. The current control circuit of claim 1, wherein the first control circuit is further arranged to generate and provide the control signal to the first current regulation element.

13. The current control circuit of claim 1, wherein the current flowing with respect to the first current regulation element is a current flowing into the first current regulation element.

14. The current control circuit of claim 1, wherein the current flowing with respect to the first current regulation element is a current flowing out of the first current regulation element.

15. The current control circuit of claim 1, wherein the first current regulation element is a series-pass device.

16. The current control circuit of claim 1, wherein the first current regulation element is a transistor.

17. The current control circuit of claim 16, wherein the first current regulation element is a bipolar junction transistor.

18. The current control circuit of claim 1, further comprising:
at least one second current regulation element, wherein each second current regulation element is arranged to be connected in parallel with the first current regulation element; and
at least one third control circuit, wherein each third control circuit is associated with a respective second current regulation element and is arranged to regulate, based on a respective reference current, current flowing with respect to the corresponding second current regulation element.

19. The current control circuit of claim 18, further comprising a coordination-controller for controlling the reference current for the first control circuit and the respective reference current for each of the at least one third control circuits.

20. The current control circuit of claim 1, wherein the second control circuit is arranged to
detect voltage across the first current regulation element, and
compare the voltage detected with the reference voltage for generation of a control signal, to substantially match the voltage across the first current regulation element to the reference voltage.

21. A current control circuit comprising:
a first current regulation element;
a first control circuit arranged to regulate, based on a reference current, current flowing with respect to the first current regulation element; and
a second control circuit arranged to regulate, based on a reference voltage, voltage across the first current regulation element, wherein
the second control circuit
comprises a first voltage regulation element that is controlled for regulating the voltage across the first current regulation element, and
is arranged to
detect voltage across the first current regulation element, and
compare the voltage detected with the reference voltage for generation of a control signal, to substantially match the voltage across the first current regulation element to the reference voltage.

22. The current control circuit of claim 21, wherein the second control circuit is further arranged to generate and provide the control signal to the first voltage regulation element.

23. A current control circuit comprising:
at least one current regulation element;
at least one first control circuit, wherein each first control circuit is associated with a respective current regulation element and arranged for regulating, based on a respective reference current, current flowing with respect to the corresponding current regulation element; and
a plurality of second control circuits, wherein each second control circuit has a voltage regulation element, that is correspondingly controlled, for regulating, based on a respective reference voltage, voltage across the corresponding current regulation element, wherein
the voltage regulation elements are connected in parallel, or
the voltage regulation elements are connected in series, or
some of the voltage regulation elements are connected in parallel and some of the voltage regulation elements are connected in series.

24. The current control circuit of claim 23, comprising a plurality of current regulation elements connected in parallel and a corresponding plurality of first control circuits.

25. The current control circuit of claim 24, further comprising a coordination-controller for controlling the respective reference currents for the plurality of first control circuits.

26. The current control circuit of claim 24 further comprising:
a first coordination-controller for controlling the respective reference currents for the plurality of first control circuits; and
a second coordination-controller for controlling the respective reference voltages for the plurality of second control circuits.

27. The current control circuit of claim 26, wherein the first coordination-controller and the second coordination-controller are in a single controller.

28. A current control circuit comprising a plurality of current control circuit modules, wherein each of the current control circuit modules comprises a current control circuit of claim 26.

29. The current control circuit of claim 23, further comprising a coordination-controller for controlling the respective reference voltages for the plurality of second control circuits.

30. A current control circuit comprising:
a first current regulation element;
a first control circuit arranged to regulate, based on a reference current, current flowing with respect to the first current regulation element; and
a second control circuit arranged to regulate, based on a reference voltage, voltage across the first current regulation element, wherein the second control circuit comprises a first voltage regulation element that is controlled for regulating the voltage across the first current regulation element, wherein,
during operation,
when the voltage across the current control circuit is larger than the reference voltage, voltage across the first current regulation element is maintained to be substantially equal to the reference voltage; and
when the voltage across the current control circuit is smaller than the reference voltage, the voltage across the first voltage regulation element is substantially equal to zero.

* * * * *